United States Patent [19]

Sachdev et al.

[11] Patent Number: 5,888,308
[45] Date of Patent: Mar. 30, 1999

[54] PROCESS FOR REMOVING RESIDUE FROM SCREENING MASKS WITH ALKALINE SOLUTION

[75] Inventors: Krishna G. Sachdev; John U. Knickerbocker, both of Hopewell Junction; Glenn A. Pomerantz, Kerhonkson; Bruce E. Tripp, Rhinebeck, all of N.Y.

[73] Assignee: International Business Machines Corporation, Armonk, N.Y.

[21] Appl. No.: 808,926

[22] Filed: Feb. 28, 1997

[51] Int. Cl.$^6$ .................................. B08B 3/12; C23G 1/14
[52] U.S. Cl. ........................ 134/1; 134/2; 134/29; 134/38; 134/40; 510/175; 510/421; 510/424; 510/435
[58] Field of Search ................ 134/1, 2, 29, 38, 134/40; 510/175, 176, 178, 421, 424, 425, 426, 427, 428, 435

[56] References Cited

U.S. PATENT DOCUMENTS

| | | | |
|---|---|---|---|
| 3,668,153 | 6/1972 | Cortty | 510/426 |
| 3,705,856 | 12/1972 | Sedliar et al. | 510/234 |
| 3,853,782 | 12/1974 | Chang | 510/172 |
| 4,453,984 | 6/1984 | Mondou et al. | 134/38 |
| 4,619,706 | 10/1986 | Squires et al. | 134/2 |
| 4,786,578 | 11/1988 | Neisius et al. | 134/38 |
| 5,158,710 | 10/1992 | VanEenam | 252/539 |
| 5,234,506 | 8/1993 | Winston et al. | 134/40 |
| 5,401,325 | 3/1995 | Mihelic et al. | 134/39 |
| 5,401,326 | 3/1995 | Mihelic et al. | 134/40 |
| 5,417,877 | 5/1995 | Ward | 134/38 |
| 5,419,779 | 5/1995 | Ward | 134/38 |
| 5,593,504 | 1/1997 | Cala et al. | 134/1 |

*Primary Examiner*—Harold Y. Pyon
*Assistant Examiner*—Saeed Chaudhry
*Attorney, Agent, or Firm*—Aziz M. Ahsan

[57] ABSTRACT

This invention relates to the use of water-based cleaning solutions and their use as environmentally safe replacements of chlorinated hydrocarbon solvents to remove metal-polymer composite paste residue from screening masks and ancillary equipment, such as, used for screening a conductive metal pattern on a ceramic green sheet in the manufacture of multi-layer ceramic products.

32 Claims, No Drawings

PROCESS FOR REMOVING RESIDUE FROM SCREENING MASKS WITH ALKALINE SOLUTION

FIELD OF THE INVENTION

This invention relates to the use of water-based cleaning solutions and their use as environmentally safe replacements of chlorinated hydrocarbon solvents to remove metal-polymer composite paste residue from screening masks and ancillary equipment, such as, used for screening a conductive metal pattern on a ceramic green sheet in the manufacture of multi-layer ceramic products.

BACKGROUND OF THE INVENTION

In the manufacture of semiconductor packaging products, such as, substrates, conductive metal pattern on a substrate is defined by conductive paste deposition through a contact mask.

A method for screening conductive paste onto ceramic green sheet is described in U.S. Pat. Nos. 4,068,994 and 4,362,486.

Screening masks used for the production of high circuit density devices have closely spaced fine dimension etched patterns. Paste screening through such masks leaves paste residue entrapped in the fine mask features. The entrapped residue requires that the mask be cleaned after one or more screening passes to maintain conductive pattern integrity in subsequent screening and provide defect-free product.

A method for in-line mask cleaning after each screening pass is described in U.S. Pat. No. 4,304,536, in which the masks are sprayed with a solvent to remove paste and subsequently dried.

In the fabrication of multi-layer ceramic substrates of the type described in U.S. Pat. No. 4,245,273, conductive pastes selected for screening are based on a variety of polymer binder-solvent vehicle systems, selection of which is dictated by the requirement for a particular circuit pattern and compatibility of the paste with greensheet materials.

Various commonly used paste types in the manufacture of multi-layer ceramic substrates are described in U.S. Pat. No. 4,245,273.

An automated in-line mask cleaning process using perchloroethylene as a cleaning solvent for Mo metal masks used in multi-layer-ceramic technology is described in U.S. Pat. Nos. 4,383,040 and 4,362,486.

Halogenated hydrocarbon solvents such as Perchloroethylene, 1,1,1-Trichloroethane, 1,1,2-trichloroethylene, methylene chloride, CFC-113, and CFC-112 traditionally have been used for cleaning/degreasing purposes in many industrial and consumer product applications. Perchloroethylene is a commonly used solvent in chemical, pharmaceutical and microelectronics industry, and is widely used in dryclean industry.

Chlorinated hydrocarbon solvents, particularly perchloroethylene and 1,1,1-trichloroethane are also used in multi-layer ceramic manufacturing. These solvents are used in cleaning processes for masks and accompanying equipment which are used in screening metal-polymer conductive paste onto ceramic green sheet for delineation of wiring and via metallurgy pattern.

Preference for chlorinated solvents in industrial cleaning processes is due to the fact that these solvents are non-flammable (no flash point) and are highly effective cleaning solvents in degreasing and removal of organic and inorganic-organic composite residues. Perchloroethylene is an especially suitable solvent for high efficiency cleaning in manufacturing environment as described in U.S. Pat. No. 4,383,040, since it is fast acting, fast drying due to relatively high vapor pressure, leaves no residue after drying, and can be recycled.

However, a major problem with halogenated hydrocarbon solvents such as perchloroethylene and trichloroethane, is that these have been found to have harmful effects on human health and the environment, therefore their use in industrial processes has become highly restricted in recent years. Specifically, this category of solvents have been identified as Hazardous Air Pollutants (HAP-solvents) which are on the OSHA list of Suspected Carcinogens (cancer causing agents), and these are among the SARA Title-III reportable (Superfund Amendment & Re-Authorization Act) compounds that are on the TRI (Toxic Release Inventory) chemicals list. In addition to these environmental and health hazards, 1,1,1-Trichloroethane is also an Ozone Depleting Substance (ODS) and thus has already been phased out while 1,1,2-trichloroethylene has been targeted for phase out by the year 2002.

With the currently imposed strict environmental regulations on hazardous/toxic chemicals, use of perchloroethylene, trichloroethane, and related chemicals in industrial applications has become very costly since it requires regular permit renewal from the state, strict compliance with rules requiring monitoring, record keeping, and precise data reporting of toxic air emissions. Adding to the cost are maintenance of emission control devices, hazardous waste disposal, and the necessary controls to assure worker safety. There is also a problem of toxic/hazardous waste and the high cost of disposal due to the presence of residual chlorinated solvent.

In-line mask cleaning processes described in U.S. Pat. Nos. 4,383,040 and 4,362,486 use perchloroethylene for automatic cleaning, i.e., they are designed for real time operation to provide cycle time compatibility with high throughput screening. This requires use of the cleaning solvent in large volume to provide for effective cleaning within the cycle time required for other steps in the screening process. Use of perchloroethylene in large volumes in turn results in high level of toxic solvent emissions and generation of large volume of hazardous solid and liquid waste. The solid waste which mainly comprises metals and inorganic components with small amount of polymer binder-solvent in the paste, also contains residual chlorinated solvent and thus is disposed-off as hazardous waste at twice the cost of a waste having non-chlorinated solvent contamination and at ten times the cost of a non-hazardous waste having no organic solvent contamination. Another problem with the use of perchloroethylene in mask cleaning is that the washed-off paste residue settles as a hard cake at the bottom of the cleaning tank as the solvent partially evaporates, which makes it difficult to recover the precious metals from the solids.

Because of the environmental concerns and the health hazards associated in the use of chlorinated solvents for industrial cleaning processes in general, there is currently a major focus on identifying environmentally safe replacements. Various chemical suppliers and cleaning equipment manufacturers have made available several alternate organic solvents that are relatively safe and mostly exempt from environmental regulations, as well as water-based cleaning solutions and the necessary equipment for alternate organic solvent and water-based cleaning.

In manufacturing applications, aqueous cleaning is generally preferred over solvent cleaning because of the flammability, cost, and waste disposal issues associated with the use of organic solvents.

Therefore, this invention is concerned with mask cleaning and particularly replacement of chlorinated solvents with a more environmentally desirable method of cleaning masks, extrusion heads, and other accompanying equipment that is used in screening conductive paste onto greensheet in the manufacture of multi-layer ceramic. Furthermore, the invention is especially concerned with cleaning of screening masks with water-based cleaning solutions based on a combination of surfactants, and alkaline detergent compositions based on alkali metal salts, alkali metal hydroxides, and combination thereof, as non-hazardous replacement of perchloroethylene, 1,1,1-trichloroethane, trichloroethylene, and related chlorinated solvents.

The inventors have discovered a group of aqueous cleaning compositions that can be used for cleaning paste from the screening masks. These aqueous cleaning compositions can be derived from: (a) combination of non-ionic and ionic surfactants in water; (b) alkaline detergent compositions based on alkali metal salts as silicate/metasilicate, carbonate, tribasic sodium phosphate, sodium tripolyphosphate, and combinations thereof; (c) highly alkaline solutions based on alkali metal salts, alkali metal hydroxides, and mixture thereof with alkanolamines.

Unlike chlorinated solvents, the aqueous cleaning compositions according to this invention have no problem of toxic air emissions or health hazards, minimizes waste, and allows recovery of precious metals from the removed paste residue in the wash liquid and thus provides multiple benefits.

PURPOSES AND SUMMARY OF THE INVENTION

It is a purpose of this invention to provide an environmentally safe water-based process to replace perchloroethylene in mask cleaning to remove paste residue from screening masks used for delineation of conductive metal patterns in ceramic manufacturing.

Another purpose of this invention is to provide a process for mask cleaning using water-based alkaline solutions based on surfactants.

Yet another purpose of this invention is to provide a process for mask cleaning using aqueous detergents a comprising alkali metal salts, alkali metal hydroxides, alkanolamines, and combination thereof.

Still yet another purpose of this invention is to provide aqueous alternatives to chlorinated solvents in mask cleaning by using alkaline solutions containing surface active agents that lower the surface tension of water and thereby promote wettability of hydrophobic pastes and consequently provide a mechanism for efficient removal of paste residue from the mask when aided by mechanical action.

It is also a purpose of this invention to provide an aqueous cleaning process for paste screening masks that is free of the environmental regulations associated with the use of chlorinated solvents.

Another purpose of this invention is to provide a replacement for chlorinated solvent based cleaning of screening masks that is free of toxic air emissions and hazardous waste disposal cost issues.

Yet another purpose of this invention is to provide a non-hazardous aqueous cleaning process for screening masks that allows reclamation of conductive metals from the solid waste and thereby offers opportunity for waste minimization and economic benefit.

Still yet another purpose of this invention is to provide aqueous cleaning options in mask cleaning that are compatible with the mask materials and the cleaning equipment.

Another purpose of this invention is to provide aqueous cleaning method for associated parts used in screening, such as, for example, nozzles, tubes, etc.

Therefore, in one aspect the invention is an aqueous cleaning process for cleaning at least one screening mask having at least one layer of screening paste thereon using at least one water-based alkaline detergent solution to remove said cleaning paste from said screening mask.

DETAILED DESCRIPTION OF THE INVENTION

In the semiconductor screening process, green sheets, such as, ceramic green sheets, are screened with a variety of pastes. These pastes normally leave behind a residual paste or paste residue on the surface of the screening masks or inside the fine features of the mask. Of course the paste residue must be removed from the screening mask if that screening mask is to be used again for the green sheet screening process. These screening masks are typically made of metal, such as, for example, molybdenum, copper/nickel or emulsion masks, such as, for example, a metal, such as, stainless steel mesh with at least one coating of a suitable emulsion.

The aqueous cleaning process of this invention has to be compatible with the materials that it comes in contact with, such as, the mask materials and the cleaning equipment. The screening equipment could be a screening mask selected from a group comprising a metal or a stainless steel mesh with at least one coating of an emulsion material. However, the screening equipment could also be selected from a group comprising screening mask, screening nozzle, screening tube, extrusion head, to name a few.

As stated earlier, there are a number of mask cleaning methods and processes already in use by the semiconductor industry, however, methods using an aqueous solutions have not been used for cleaning of these screening masks.

Aqueous cleaning as an alternative to solvent based systems have been successfully used in degreasing/cleaning processes for electronic circuit assemblies, such as, printed circuit boards and other parts in device fabrication. Aqueous cleaning compositions can be mildly alkaline with pH in the range from about 8 to about 10 which are generally based on a combination of ionic, non-ionic, and optionally chelating surfactants and other pH controlling additives in water and high boiling water soluble organic solvent component, or these can be highly alkaline (pH>12) aqueous detergent systems comprising alkali metal silicates, metasilicates, hydroxides, carbonates, sesquicarbonates, tripolyphosphates, and combination thereof. Some of the aqueous formulations containing these salts are described in U.S. Pat. Nos. 5,234,506 and 5,264,047 for removing soldering flux, wax and grease from printed circuit boards. Alkaline detergent formulations may also contain low molecular weight amines as monoethanolamine, di-ethanolamine, triethanolamine in conjunction with alkali metal salts/hydroxides, and ionic surfactants, such as, dodecylbenzene sulfonic acid sodium salt, alkyl aryl sulfonate sodium salt, sodium xylene sulfonate. Some of the commercially available aqueous cleaning concentrates for example are: surfactant-based aqueous formulation "Micro" concentrate from International Products Corporation; several highly alkaline pH aqueous formulations available from Ecolabs are based on sodium metasilicate, sodium metasilicate and chlorine bleach compounds, sodium metasilicate-ethanolamine concentrate, "Heavy Duty Grease Remover" comprising sodium hydroxide-ethanolamine-surfactant blend, and an aqueous cleaning solution comprising sodium metasilicate and 2-butoxyethanol available from Castrol North America. Other types of aqueous and semi-aqueous cleaning compositions that have been described recently are: D-Limonene containing aqueous solution comprising D-Limonene and a combination of ionic and non-ionic surfactants in water are described in U.S. Pat. No. 4,511,488. Terpene-based microemulsion cleaning solutions such as the ones disclosed in U.S. Pat. No. 5,401,325, are based on mixture of surfactants, a water soluble glycol ether, a sparingly water-soluble organic solvent, and morpholine in water. These solutions are claimed to be effective in removing baked-on oil and carbon deposits, and oil grease from various electronic device surfaces.

According to this invention, an aqueous alternative to perchloroethylene should be non-toxic, environmentally more desirable mask cleaning solution that should be effective in removing all types of the commonly used conductive pastes in multi-layer ceramic manufacturing.

The various screening paste types used to define wiring and via metallurgy onto greensheet are typically comprised of metal powder as Molybdenum, Copper, Tungsten which may also contain inorganic fillers as glass, ceramic powder, or Al-Si frit, and small amount of organic polymer as binder such as ethylcellulose, acrylate polymers as polymethylmethacrylate, petroleum hydrocarbon resins which are all hydrophobic, or the binder can be hydrophilic such as hydroxyethyl cellulose, hydroxypropyl cellulose, hydroxymethyl cellulose, and the like; and a high boiling alkanol-ester or glycol ether type solvent vehicle such as 2,2,4-trimethylpentane diol, glycol ether alkylates as 1,3, monoisobutyrate, diethylene glycol monomethylether acetate, diethylene glycol monobutylether acetate and the like that have low evaporation rate; and other necessary additives as surfactants/dispersants and thickening agents for desired paste viscosity and rheology suitable for a particular screening application.

Other ingredients as antioxidants and coloring agents may also be added in certain paste compositions. Some of the commonly used conductive pastes in multi-layer ceramic fabrication are described in U.S. Pat. No. 4,245,273. Depending on the polymer binder-solvent vehicle system used, the paste can be polar or non-polar, hydrophobic or oleophilic. Screening of such pastes onto ceramic greensheet using metal mask or mesh mask for silk screening leave residual paste on the mask which requires that the mask be cleaned after one or more screening passes so that any accumulated paste residue is removed in order to prevent defects in the screened pattern that may be caused by dried paste particles in the active region of the mask caused by partial solvent evaporation.

The inventors have unexpectedly found that screening masks having paste residues from a variety of conductive paste types having polar and non-polar characteristics can be effectively cleaned with water-based solutions of pH from about 9 to about 10 comprising ionic and non-ionic surfactants and optionally a chelating surfactant and a water soluble organic solvents, and also with alkaline detergents of pH>10 based on alkali metal salts, hydroxides, alkanolamines, and combination thereof. It has been further found that acidic pH aqueous cleaning solutions, pH from about 2.5 to about 4.0 based on carboxylic acids and/or salts thereof, non-ionic surfactants and water soluble glycol ether solvent are effective in removing only certain polar paste residues from the mask when ultrasonically agitated at about 160°–165° F. for about 3 to about 4 minutes.

Aqueous solutions that are preferred according to this invention are characterized by:

(a) controlled pH (from about 9 to about 10) water-based detergents based on surfactants as non-ionic, ionic, and optionally chelating surfactant and a water-soluble organic solvent, and may contain corrosion inhibitor, defoamer etc;

(b) aqueous solutions having pH from about 11 to about 13 comprising alkali metal salts such as alkali metal silicates that include sodium metasilicate and potassium metasilicate; alkali metal hydroxides as sodium hydroxide, potassium hydroxide; sodium carbonate, potassium carbonate, and combination thereof, which may also contain surface active agents and low molecular weight aliphatic amine additives as ethanolamines, and other modifiers;

(c) phosphate-free aqueous solutions which contain no builders such as trisodium phosphate or STPP (sodium tripolyphosphate), or alkyl phosphate ester;

(d) which contain no chlorine bleach compound.

The aqueous compositions of type (a) described above, according to this invention are comprised of about 2 to about 10 percent (weight percent) of a combination of non-ionic, ionic and chelating surfactant (optional) as active ingredient and from about 10 to about 30 percent of a soluble organic solvent in water. Typical non-ionic surfactants that are well known in the art include ethoxylated alkyl phenols, ethoxylated long chain linear alcohols as polyoxyethylene nonyl phenyl ether, poly-(oxyethylene-oxypropylene)undecyl ether poly(oxyethylene)-octylphenyl ether, poly (oxyethylene)undecyl ether, poly(oxyethylene)dodecyl ether, polyoxyethylene sorbitan stearates, and related systems; useful ionic surfactants include alcohol ether sulfates, linear alkyl aryl sulfonates such as sodium and/or ammonium salt of dodecyl benzene sulfonic acid, alkanolamine salts as quaternary ammonium salt containing cationic-anionic complex typically, aryl sulfonic acid dimethyl ammonium, dodecyl benzene sulfonic acid triethanolamine salt, dodecyl benzene sulfosuccinate, diisooctyl sulfosuccinate, and the like, and representative chelating surfactants which can optionally be included are based on complexes of ethylenediamine tetraacetic acid sodium salt complexes with amino acids, amines, and amino alcohols.

An aqueous alkaline solution that was found effective in washing-off both the polar and non-polar paste residue had pH about 9.5 and contained from about 3 to about 4 percent of the active ingredients comprising poly(oxyethylene-oxypropylene)alkyl aryl ether, benzene sulfonic acid dimethylammonium salt, dodecylbenzene- sulfonic acid triethanolamine salt, and ethylenediamine tetraacetic acid sodium salt complex with amino acid as non-ionic, ionic, and chelating surfactants, respectively, and about 10 to about 20 percent of a water soluble organic solvent. In a representative cleaning experiment using about a 4 percent solution of (weight percent based on the solution volume) "Micro-90 or Micro-6731" (a surfactant-based concentrate from International Products Corporation), concentrate in deionized water and about 10 to about 30 percent soluble organic solvent mix, it was found that when Mo metal masks having paste residue after use in a screening pass were immersed in this solution that was pre-heated at about 160° to about 165° F. and ultrasonically agitated for about 2 to about 4 minutes, both the polar and non-polar paste types were completely cleaned-off from all areas of the mask including the fine features. After ultrasonic agitation, the masks were immediately spray rinsed with warm water at about 30 to about 40 psi pressure and blow dried with air to provide clean masks suitable for subsequent screening pass. It was found that pressurized spray cleaning was less effective with these compositions due to foaming problems. For faster drying, the masks are preferably spray rinsed with hot water after ultrasonic cleaning in the surfactant based cleaning solution and then hot air dried. Alternatively, for rapid drying, the masks can be spray rinsed with a lower boiling solvent as isopropyl alcohol or simply exposed to its vapor after the water rinse and then air dried.

It was also found that addition of about 10 to about 20 percent of about 4 percent aqueous sodium hydroxide-ethanolamine cleaning solution to about 4 weight percent solution (based on total volume of solution) of the "Micro" concentrate in deionized water without added organic solvent causes very little change in pH but it provides further improvement in mask cleaning efficiency with ultrasonic agitation reducing the cycle time. It was found that the surfactant-based cleaning solution prepared with "Micro-90 or Micro-6731" concentrate in the absence of organic solvent or a high pH cleaning solution also is effective as a mask cleaning medium to remove various types of pastes but it requires somewhat higher temperature from about 165° to about 170°F. and longer ultrasonic agitation. Representative water soluble organic solvent candidates useful for the purpose of this invention are: 3-methoxy-1-butanol, dipropyleneglycol alkylethers as dipropylene glycol monomethyl ether, dipropylene glycol monobutylether, tripropyleneglycol alkylethers, benzyl alcohol, and the like.

In another aspect of this invention, high pH aqueous detergents (pH from about 11 to about 13), particularly those comprising sodium hydroxide and low molecular weight aliphatic amines such as mono-ethanolamine, di-ethanolamine, and triethanolamine and surfactants; sodium metasilicate and/or potassium metasilicate and monoethanoleamine, sodium and/or potassium metasilicate, mixture of sodium carbonate/sodium metasilicate, sodium carbonate/sodium metasilicate/sodium hydroxide, and the corresponding potassium salts thereof, and optionally comprising a surfactant provide effective cleaning of paste screened masks with ultrasonic agitation or pressurized spray at a temperature from about 140° to about 155° F. Representative high pH aqueous solutions found useful as replacement of perchloroethylene in the cleaning of screening masks using ultrasonic agitation or pressurized spray at a temperature from about 135° to about 155° F. are: from about 3 to about 5 weight percent solution of concentrate ("Heavy Duty Grease Remover Plus" available from Ecolabs) based on volume of cleaning solution in water and comprising mixture of sodium hydroxide, ethanolamine and surfactants; from about 2 to about 5 weight percent solutions of sodium metasilicate pentahydrate which may optionally contain a surfactant; and sodium metasilicate-sodium hydroxide blend with silicate:hydroxide ratio in the range about 1:4 to about 4:1; sodium metasilicate-sodium hydroxide-sodium carbonate mixtures, and the like. These high pH cleaning solutions can be further modified by incorporation of sodium tripolyphosphate or related phosphate detergents for the desired cleaning effectiveness. For example, aqueous solution comprising sodium metasilicate-sodium hydroxide-sodium tripolyphosphate with relative ratio in the range about 8:1:1 to about 5:3:2 can be used for mask cleaning with ultrasonic agitation or with pressurized spray. However, for the purpose of this invention, the phosphate carrying detergent solutions are less preferred due to ecological concerns and the special treatment requirement in the case of phosphate carrying effluent before waste water can be safely discharged. Commonly used detergent-based cleaning compositions as automatic machine dishwashing liquids also have been found effective in removing paste residue from the masks.

Among the acidic pH detergents tested for mask cleaning, it is found that a 4 percent solution of Ultrax 102S, a commercially available concentrate (Peter Wolters, West Germany) which also contains other modifiers as corrosion inhibitors, stabilizers, and defoamers, also works for mask cleaning with ultrasonic agitation but only for certain types of paste residues.

According to this invention, it is found unexpectedly that the metal solids and other suspended material in the wash liquid from mask cleaning with the aqueous cleaning solutions as described above essentially completely settle at the bottom as granular material upon standing which can be easily removed by filtration and recovered. This is unpredicted and is in contrast to the hard unfilterable and intractable mass formed when perchloroethylene is used as a cleaning solvent. The metal solids in the aqueous wash can be readily removed by filtration and reclaimed to recover pure metals while the effluent can be safely discharged or the waste water can be recycled. It is also found that in the aqueous cleaning process described herein, the same cleaning solution can be used more than once without significant impact on cleaning effectiveness. For example, in a batch operation using ultrasonic agitation, a one gallon of the solution can be reused, such that, 2 to 4 masks are cleaned before it is replaced by fresh solution. Metals recovery and reuse of the aqueous cleaning process described herein offers major benefit in terms of waste minimization, cost reduction and thus economics in contrast to cleaning with chlorinated solvents where in addition to the environmentally hazardous volatile emission issues, the solids are disposed-off as hazardous waste.

The aqueous cleaning solution of this invention is an environmentally safe replacement of chlorinated solvents for mask cleaning in ceramic manufacturing technology in the removal of paste residue.

It has also been discovered that the water-based alkaline detergent solution of this inventive process causes the separation of metal solids from the screening paste into filtrable material which can be recovered and also recycled.

EXAMPLES

Various aspects of the present invention are further illustrated by referring to the following examples which are intended only to further illustrate the invention and are not intended to limit the scope of the invention in any manner.

EXAMPLE 1

Mo metal masks having etched patterns suitable for multi-layer ceramic substrates typically having fine wiring, via, and I/O pad etched patterns were used for screening conductive pastes onto ceramic greensheet with a paste screening tool. Various conductive pastes used for screening in ceramic technology generally comprise of metal filler as the predominant component in a polymer binder-solvent vehicle matrix. Representative pastes used for mask cleaning with aqueous solutions according to this invention are comprised of about 70–85 percent metal filler as Molybdenum, Copper, Nickel and Tungsten powder in cellulosic binders with high boiling polar solvents, such as, alkanol-esters of the type 2,2,4-trimethylpentane diol 1,3- monoisobutyrate, or glycol ether alkylate, such as, diethylene glycol alkylether acetate type solvent vehicle in conjunction with fatty acid ester based surfactant, thickening agents, and other additives like antioxidants, coloring agents, corrosion inhibitors, etc. Also tested were non-polar conductive pastes based on low molecular weight thermoplastic resins derived from petroleum hydrocarbons as the binder in place of cellulosic binders and long chain hydrocarbons oil as solvent vehicle. Some of the pastes, in addition to carrying metal powder as the major component also contained inorganic fillers such as glass, ceramic, $Al_2O_3$—$SiO_2$ frit. Masks carrying the paste residue after the screening operation were cleaned using the following representative aqueous cleaning solutions and process according to the present invention:

(a) A solution of Micro-6731 concentrate (A product of International Products Corporation) was prepared by diluting 1,600 cc of the concentrate (about 50–60 percent active ingredients) to 10 gallons with deionized water. This was heated at about 155°–160° F. in an ultrasonic bath operated at 20 KHz frequency. Mo metal masks having paste residue remaining after the screening pass were immersed in this solution and ultrasonically agitated for about 3–4 min, spray rinsed immediately with hot deionized water, and then blow dried with air. Microscopic inspection of the cleaned masks showed complete removal of residue from all areas of the mask in the case of polar pastes that comprised of ethylcellulose as the binder and ethyleneglycol alkylether acetate or alkanol-ester type solvent vehicle systems. However, the non-polar paste residue comprising hydrocarbon resin binder with non-polar oil solvent vehicle were only partially cleaned. Effective cleaning was also obtained with ultrasonic agitation at room temperature but the time required was much longer somewhat than with heated solutions.

(b) To the cleaning solution used in (a) above, up to 20 percent of 3-methoxy-1-butanol and/or dipropyleneglycol monomethyl ether (vol. percent based on the volume of the solution) were added and the mixture was heated at 155°–165° F. in an ultrasonic bath operated at 20 KHz. Masks carrying paste residue from various types of pastes were immersed in this solution and ultrasonically agitated for 2–3 minutes followed by spray rinse with deionized water and blow dry with air. Microscopic examination of the masks after cleaning showed no evidence of residue on the surface or any of the fine features including the wire mesh features on the mask. This organic solvent modified aqueous surfactants based cleaning solution was found to be effective in cleaning both the polar and non-polar paste residue and also provide enhancement of cleaning efficiency relative to the unmodified solution. These solutions can also be used with pressurized spray cleaning at less than 30–40 psi. Higher pressure spray with these solutions was not found suitable due to foaming problems.

(c) Another modified version of the surfactant-based cleaning solution was prepared by blending one gallon of the cleaning solution used in (a) and 500 cc of a 10 weight percent solution (based on the volume of solution, pH 12.7) of a "Heavy Duty Grease Remover Plus" concentrate (available from Ecolabs) comprising sodium hydroxide/ethanolamine/surfactant mixture in water. The resulting solution was heated to 147°–155° F. in the ultrasonic bath and tested for mask cleaning by following the process described above in (a). Cleaning tests with paste residue from both the polar and non-polar paste types showed effective cleaning of both types of pastes.

EXAMPLE 2

In another experiment, an acidic pH aqueous cleaning solution (pH 2.5–4.0) was used according to the process described in Example 1 (a) for removal of paste residue from metal masks. A solution of Ultrax 102S cleaner (Peter Wolhard, West Germany), an acidic pH cleaner, was prepared by dissolving the concentrate in deionized water such that a concentration of about 4–5 weight percent (based on the solution volume) was formed. The Ultrax 102S cleaner comprises carboxylic acid/salts thereof, non-ionic and anionic surfactants blend, a water soluble glycol ether solvent, and other additives such as corrosion inhibitor, stabilizer etc. Mask cleaning with ultrasonic agitation at 155°–165° F. showed that paste residues are essentially removed but a thin surface layer due to paste organics remains on the mask which could not be rinsed off in the follow-on water spray rinse.

EXAMPLE 3

Following aqueous alkaline solutions having pH 11–13 were used for cleaning with ultrasonic agitation and pressurized spray at elevated temperature. After the cleaning step, the masks were immediately spray rinsed with hot water and hot air blow dried. In both the ultrasonic and the spray cleaning process, highly effective and efficient removal of paste residue from all types of pastes was obtained from all areas of the masks including the fine line pattern regions:

(a) Sodium metasilicate pentahydrate ($Na_2SiO_3 \cdot 5H_2O$), 530 grams was dissolved in deionized water and made up to 4 gallons of solution to provide about 3.5 percent concentration of the pentahydrate having effective concentration of sodium metasilicate active ingredient at about 2.7 weight percent (based on the solution volume). The solution was heated to 140°–145° F. and sprayed onto the masks carrying residual paste, through a single nozzle at 50–60 psi pressure for about 30–40 seconds. After pressurized spray cleaning, the masks were immediately spray rinsed with hot deionized water at about 30 psi and blow dried with hot air. Microscopic inspection of the masks thus cleaned showed no evidence of residual paste in any area of the mask. The volume of the cleaning solution used up in this spray clean process was measured to be about 2500–3500 ml/mask. The same solution when tested using the immersion process with ultrasonic agitation, showed rapid dislodging of the residual paste from the mask surface requiring less than 20 seconds to clean essentially all areas of the mask. In addition to cycle time advantage, with ultrasonic process, the spent solution could be re-used for multiple masks cleaning without effecting the cleaning performance. After the cleaning step, the masks were spray rinsed with hot deionized water and blow died with hot air.

(b) An aqueous solution comprising blend of sodium metasilicate and sodium carbonate was prepared such that the cleaning solution contained about 1.8 weight percent sodium metasilicate and 0.2 weight percent sodium carbonate. For mask cleaning, the solution was heated at 140°–145° F. and sprayed onto masks carrying residual paste from a prior screening pass, with a single nozzle at about 70 psi pressure for about 35 seconds followed by spray rinse with water at about 110° F., and hot air dry. Microscopic inspection of the cleaned masks showed no evidence of residual paste on the mask. Volume of the cleaning solution used in this experiment was found to be in the range 2500–3500 ml/mask. The same solution provided excellent cleaning with ultrasonic cleaning as with Example 3 (a).

(c) An aqueous solution comprising blend of sodium metasilicate, sodium hydroxide, and sodium carbonate was prepared to obtain about 1.7–1.8 wt. percent of these active ingredients with relative ratio of about 7:2:1 for the three components silicate/hydroxide/carbonate. Mask cleaning with this solution with pressurized spray and with ultrasonic agitation according to the process described above showed excellent cleaning of all types of pastes on all types of masks with increased cleaning efficiency and cycle time advantage in comparison to silicate alone as described in Example 3(a).

(d) Another high pH (>12) aqueous cleaning solution was prepared from the commercially available "Heavy Duty Grease Remover Plus" concentrate from Ecolabs comprising sodium hydroxide-ethanolamine-surfactant mixture, to obtain about 5–6 weight percent solution (based on the solution volume). Mask cleaning with this solution using ultrasonic agitation process was found to be effective in efficient mask cleaning for all types of paste residue. This solution, however, was not found suitable for pressurized spray cleaning due to foaming problem caused by the added surfactants.

In addition to the above aqueous solutions, a solution having pH 12.8 comprising 0.85 percent sodium hydroxide and 0.2 percent sodium carbonate (wt. percent based on solution volume), and between about 200 to about 300 ppm (parts per million) of a surfactant such as DowFax 2Ao was also tested for mask cleaning with pressurized spray process and with ultrasonic agitation at between about 150° to about 160° F. It was found that with ultrasonic agitation, it is effective in removing all paste type residue while with pressurized spray, a thin film of polymer remains on the mask for certain paste types.

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An aqueous cleaning process for cleaning at least one screening equipment having at least one layer of screening paste comprises of metal filler with a polymeric binder, a solvent vehicle, a thickening agent, surfactant/dispersant, antioxidant and corrosion inhibitor thereon by contacting at least one water-based alkaline detergent solution to remove said cleaning paste from said screening equipment.

2. The aqueous cleaning process of claim 1, further comprising at least one detergent composition selected from a group consisting of alkali-metal salts, alkali metal hydroxides, aliphatic amines, and combination thereof.

3. The aqueous cleaning process of claim 1, wherein said screening equipment is a screening mask selected from a group consisting of metal or a stainless steel mesh with at least one coating of an emulsion material.

4. The aqueous cleaning process of claim 1, wherein said water based alkaline detergent solution is put through an ultrasonic agitation at a temperature from between about 140° to about 160° F.

5. The aqueous cleaning process of claim 1, wherein said water based alkaline detergent solution is put through a pressurized spray at a temperature from between about 140° to about 160° F.

6. The aqueous cleaning process of claim 1, wherein said alkaline detergent is an aqueous solution of at least one alkali metal salt.

7. The aqueous cleaning process of claim 1, wherein said alkaline detergent solution is a mixture of alkali metal salt and wherein said alkali metal salt are selected from a group consisting of alkali metal silicates which are selected from a group consisting of sodium metasilicate, potassium silicate, and carbonates selected from a group consisting of sodium carbonate, potassium carbonate, sodium sesquicarbonate, and mixtures thereof.

8. The aqueous cleaning process of claim 1, wherein said alkaline detergent solution is a mixture of alkali metal hydroxide, alkali metal salts or combination thereof.

9. The aqueous cleaning process of claim 1, wherein said alkaline detergent solution is a mixture of alkali metal hydroxide, alkali metal salt and a surfactant, and wherein said alkali metal hydroxide is selected from a group consisting of sodium hydroxide, potassium hydroxide, and mixtures thereof.

10. The aqueous cleaning process of claim 1, wherein said alkaline detergent solution is a mixture of alkali metal salt and at least one surfactant.

11. The aqueous cleaning process of claim 1, wherein said alkaline detergent solution is a mixture of alkali metal salt, wherein said alkali metal salt is selected from a group consisting of sodium metasilicate, potassium metasilicate, sodium carbonate, potassium carbonate and sodium sesquicarbonate.

12. The aqueous cleaning process of claim 1, wherein said alkaline detergent solution is a mixture of alkali metal hydroxide and aliphatic amine.

13. The aqueous cleaning process of claim 1, wherein said alkaline detergent solution comprises of aliphatic amine, alkali metal hydroxide and at least one surfactant, and wherein said aliphatic amine are selected from a group consisting of mono-ethanolamine, di-ethanolamine, tri-ethanolamine and mixtures thereof.

14. The aqueous cleaning process of claim 1, wherein said alkaline detergent solution is a mixture of alkali metal salt or mixture thereof with hydroxides and aliphatic amines, and wherein this mixture constitute from about 1 to about 5 percent as active ingredients in water to provide aqueous cleaning solution with pH in the range from about 11.5 to about 13.0.

15. The aqueous cleaning process of claim 1, wherein said alkaline detergent solution is a mixture of alkali metal hydroxide and alkali metal hydroxide-alkali metal salt and hydroxide-salt-aliphatic amine blend, and wherein these ingredients constitute from about 1 to about 10 percent as active ingredients in water.

16. The aqueous cleaning process of claim 1, wherein said alkaline detergent is an aqueous solution of at least one non-ionic and at lease one ionic surfactant, and has pH in a range from about 8 to about 10.

17. The aqueous cleaning process of claim 16, wherein said surfactant combination in water comprises of non-ionic and ionic surfactants in an amount between about 2 to about 10 percent.

18. The aqueous cleaning process of claim 16, wherein weight ratio of non-ionic to ionic surfactant is between about 10:1 to about 1:10.

19. The aqueous cleaning process of claim 16, wherein said non-ionic surfactant is selected from a group consisting of ethoxylated alkyl phenols and ethoxylated long chain linear alcohols.

20. The aqueous cleaning process of claim 16, wherein said non-ionic surfactant is selected from a group consisting of ethoxylated alkyl phenols and ethoxylated long chain linear alcohols, and wherein said ethoxylated long chain linear alcohols are selected from a group consisting of poly(oxyethylene-oxypropylene)nonyl phenyl ether, poly(oxyethylene) dodecyl ether and poly(oxyethylene) sorbitan stearates.

21. The aqueous cleaning process of claim 19, wherein said ionic surfactant is selected from a group consisting of alkyl benzene sulfonic acid sodium salt, alkyl benzene sulfonic acid ammonium salt or combination thereof.

22. The aqueous cleaning process of claim 19, wherein said ionic surfactant is selected from a group consisting of alkyl benzene sulfonic acid sodium salt, alkyl benzene sulfonic acid ammonium salt or ammonium salt, and wherein said ammonium salt is selected from a group consisting of dodecylbenzene sulfonic acid-sodium salt, dodecylbenzene sulfonic acid diethanolamine salt and triethanolamine salt.

23. The aqueous cleaning process of claim 16, wherein said surfactants solution also comprises a high boiling water soluble organic solvent.

24. The aqueous cleaning process of claim 16, wherein said surfactants solution consists of a high boiling water soluble organic solvent, and wherein said high boiling water soluble organic solvent is selected from the group consisting of benzyl alcohol, dipropylene glycol alkyl ethers, tripropylene glycol alkyl ethers, 3-methoxy-1-butanol, methoxy propanol and mixtures thereof.

25. The aqueous cleaning process of claim 16, further comprising a chelating surfactant.

26. The aqueous cleaning process of claim 25, wherein said chelating surfactant is selected from a group consisting of ethylenediamine tetraacetic acid alkali metal salt complex with alkyl amines, amino acids and alkanolamines.

27. The aqueous cleaning process of claim 25, wherein said combination of non-ionic, ionic, and chelating surfactants constitute from about 2 to about 10 percent as active ingredients in water to form a cleaning solution having pH in the range from about 8 to about 10 for use in said removal of said paste from said screening mask.

28. The aqueous cleaning process of claim 16, further comprising a high boiling water soluble organic solvent.

29. The aqueous cleaning process of claim 1, wherein said screening equipment is selected from a group comprising screening mask, screening nozzle, screening tube and extrusion head.

30. The aqueous cleaning process of claim 29, wherein said process of mask cleaning with said water-base alkaline detergent solution involves ultrasonic agitation at between about 140° to about 160° F.

31. The aqueous cleaning process of claim 29, wherein said process of mask cleaning with said water-base alkaline detergent solution involves pressurized spray at between about 140° to about 160° F.

32. The aqueous cleaning process of claim 1, wherein said water-based alkaline detergent solution causes separation of metal solids from said screening paste into filtrable material for recovery and recycling.

\* \* \* \* \*